United States Patent [19]
Loo et al.

[11] Patent Number: 5,380,956
[45] Date of Patent: Jan. 10, 1995

[54] MULTI-CHIP COOLING MODULE AND METHOD

[75] Inventors: Mike C. Loo, San Jose; Marlin R. Vogel, Fremont, both of Calif.

[73] Assignee: Sun Microsystems, Inc., Mountain View, Calif.

[21] Appl. No.: 87,950

[22] Filed: Jul. 6, 1993

[51] Int. Cl.⁶ .............................. H05K 1/00
[52] U.S. Cl. .................... 174/252; 174/261; 174/17 LF; 174/17 CT; 257/714
[58] Field of Search ........ 174/252, 261, 15.1, 174/17 R, 17 LF, 17 CT, 260; 257/522, 524, 573, 632, 706, 712, 714, 723

[56] References Cited

U.S. PATENT DOCUMENTS

| | | |
|---|---|---|
| 3,851,221 | 11/1974 | Beaulieu et al. |
| 4,554,575 | 11/1985 | Lucas |
| 4,963,697 | 10/1990 | Peterson et al. |
| 4,964,019 | 10/1990 | Belanger, Jr. |
| 5,138,433 | 8/1992 | Hiruta |
| 5,191,404 | 3/1993 | Wu et al. |
| 5,245,216 | 9/1993 | Sako |
| 5,270,571 | 12/1993 | Parks et al. |
| 5,280,192 | 1/1994 | Kryzaniwsky |

*Primary Examiner*—Leo P. Picard
*Assistant Examiner*—Cheryl R. Figlin
*Attorney, Agent, or Firm*—James W. Rose

[57] ABSTRACT

A liquid cooling module for semiconductor chips is disclosed. The module includes a plurality of substrates, each containing at least one chip. The substrates are arranged in the module so that when coolant flows through the module, the coolant is exposed to the top and bottom surfaces of the chips. A gasket is used between each substrate. The gasket is made if a Z-axis elastomeric material that is impervious to liquid and therefore directs the flow of the coolant in the module and makes the module liquid tight. The material also is conductive in the Z direction, but not the X or Y direction, thereby making electrical communication between the chips on different substrate levels possible. The module is intended to be attached to a circuit board, thus simplifying the layout of liquid cooled chips on the board.

23 Claims, 7 Drawing Sheets

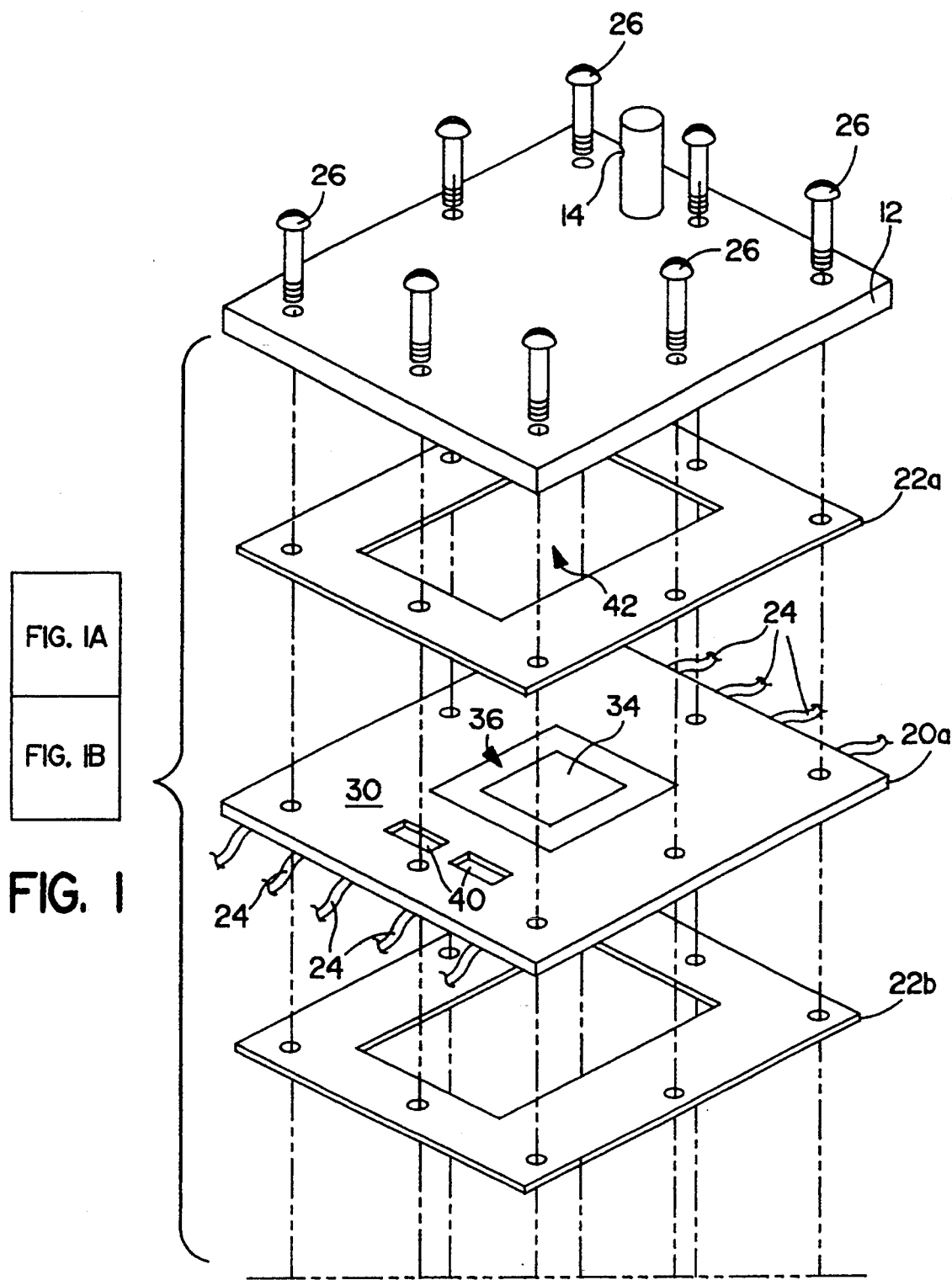
FIG. IA

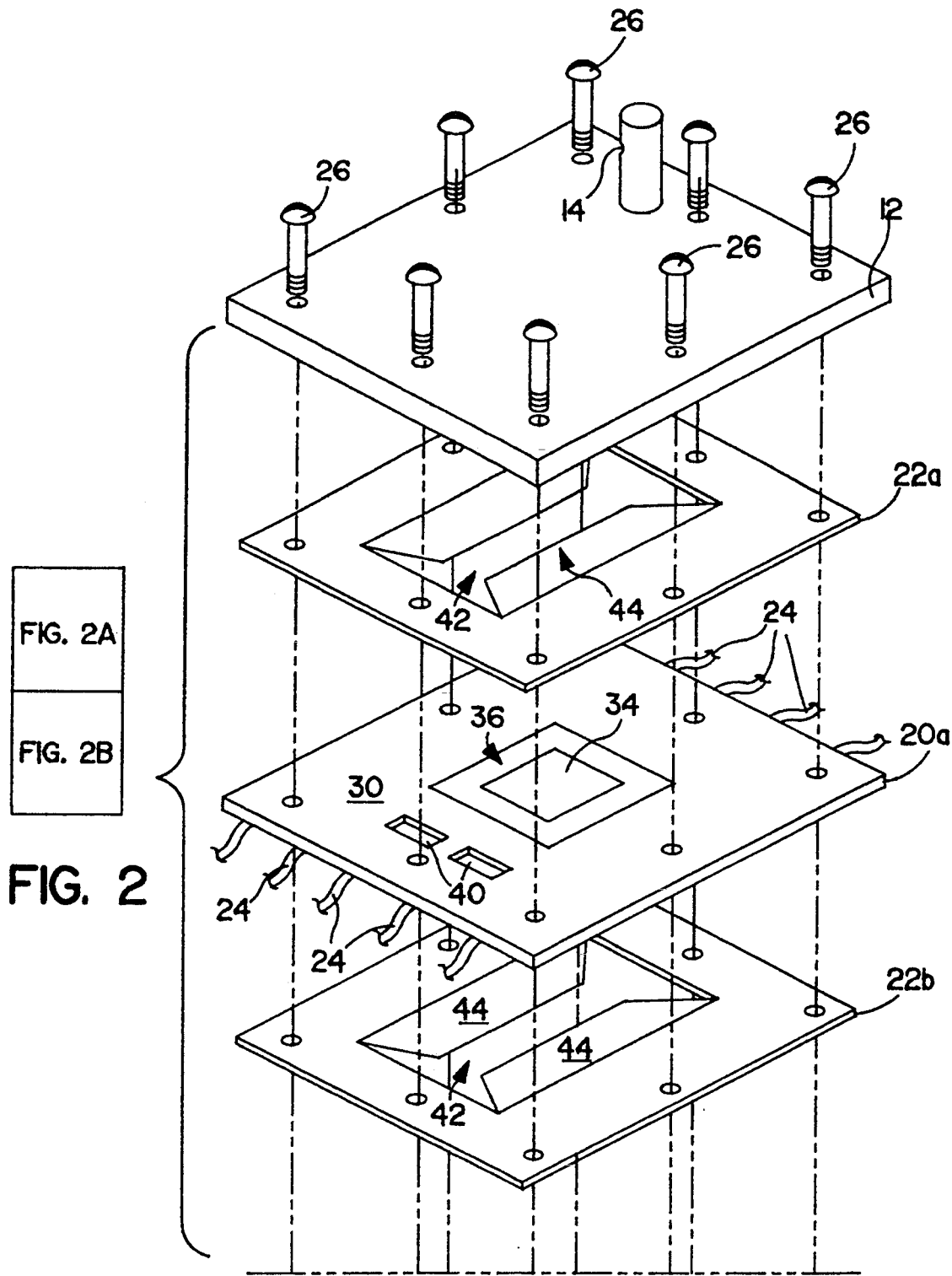

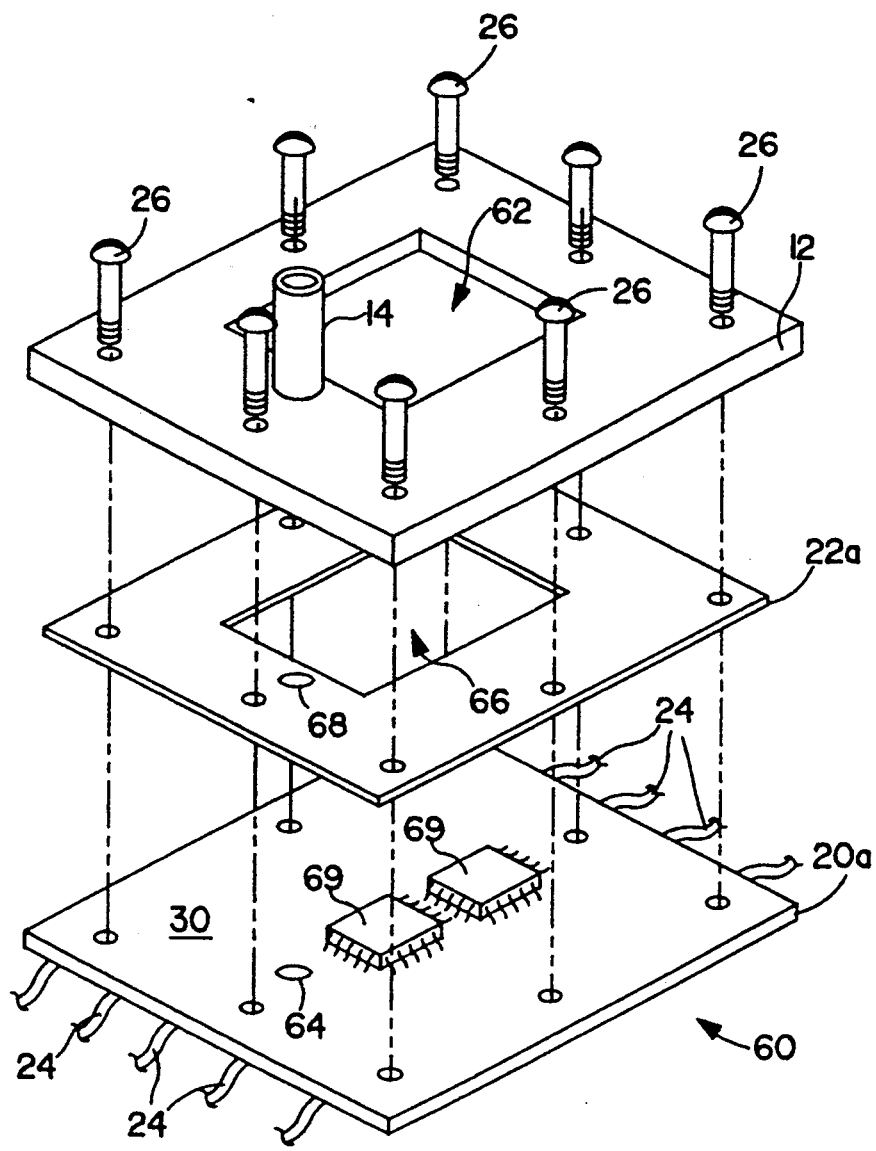

MULTI-CHIP COOLING MODULE AND METHOD

BACKGROUND OF THE INVENTION

1. Field of the Invention

The present invention relates to the field of cooling semiconductor chips, and more particularly, to a multi-chip liquid cooled module and method.

2. Background of the Invention

Certain high-powered semiconductor chips operate at extremely hot temperatures, thus requiring the need for liquid cooling. Current cooling techniques generally involve mounting the chip package on a printed circuit board, and circulating a coolant over the top surface of the chip package. Another technique involves mounting the chip package over a hole formed in the circuit board. Coolant is then circulated under the bottom surface of the package through the hole. In both techniques, the coolant comes in contact with one surface of the package, thereby drawing heat away from the chip.

The prior art cooling technique has a number of disadvantages and limitations. Only one surface of the chip is exposed to the coolant. Thus, the amount of heat removed from the chip is limited. Each chip on a board that needs to be cooled must be separately mounted onto the board. This consumes a large amount of space on the board and makes the task of board lay out difficult. Lastly, the task of reworking the board (i.e., replacing defective chips on the board) is problematic. Replacement of a defective chip requires melting the solder used to mount the chip, removal of the chip, and board preparation for the resoldering of a new chip. All of these tasks are difficult on a densely populated circuit board.

SUMMARY OF THE INVENTION

The present invention provides a cooling module for semiconductor chips. The module includes a first plate for receiving coolant and a second plate for dispensing coolant. A plurality of stacked substrates are provided between the first and second plates. A chip is provided on each substrate, with a substantial portion of the top surface and the bottom surface of the chip package being exposed. The module also includes a gasket between each substrate. The gasket is used as a sealant to make the module liquid tight and to confine and direct the flow of the coolant in the module. A Z-axis elastomeric material may be used to form the gasket while also serving to conduct electrical signals between chips on the various substrate levels. A plurality of screws and bolts clamp the first and second plates together, thereby forming a liquid tight module. When coolant is introduced into the module, it cascades in a sequential fashion over and under each substrate. In this way, the coolant contacts the top surface and the bottom surface of each chip in the module, thereby cooling the chips contained therein.

The cooling module of the present invention provides many advantages. Since both the top and bottom surfaces of the chip are exposed to coolant, the present invention is more effective in reducing operating temperatures than the prior art cooling techniques. All of the chips that require cooling in the computer, for example, one or more microprocessors, a memory management chip, and cache memory chips, can be contained in a single module. The chips in the module are stacked in the vertical direction, which saves valuable space on the circuit board and simplifies the task of board lay out. Lastly, a substrate containing a defective chip can be readily replaced with another substrate containing a new chip. Thus the task of board rework is greatly simplified.

DESCRIPTION OF THE DRAWINGS

The objects, features and advantages of the apparatus and method of the present invention will be apparent from the following description in which:

FIGS. 1A and 1B illustrate a perspective view of a multi-chip cooling module according to one embodiment of the present invention.

FIGS. 2A and 2B illustrate a perspective view of another multi-chip cooling module according to another embodiment of the present invention.

FIG. 4 illustrates a chip cooling module according to another embodiment of the present invention.

DESCRIPTION OF THE PREFERRED EMBODIMENT

Figure 1B:
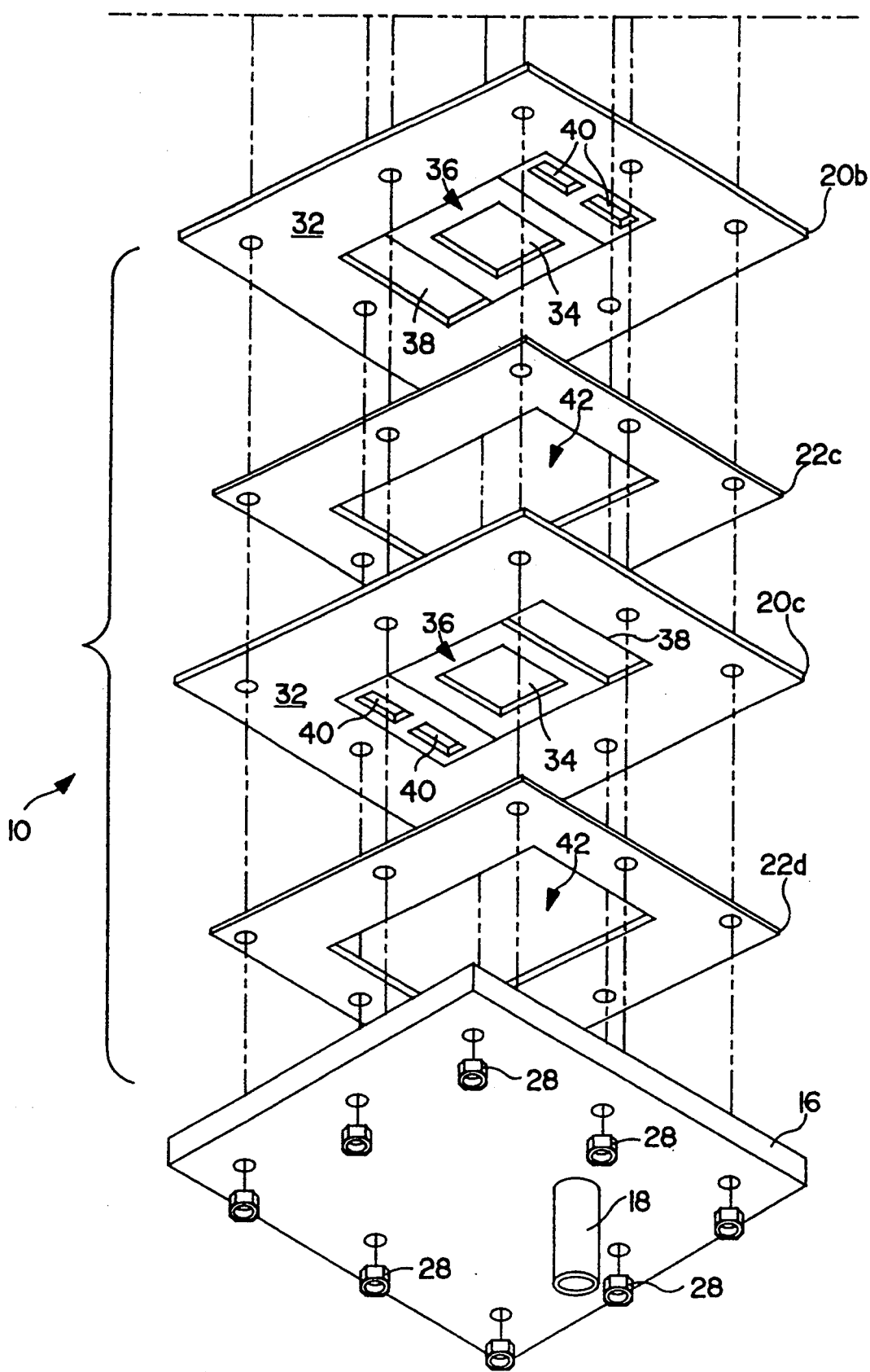

Referring to FIG. 1, a multi-chip liquid cooled module according to one embodiment of the present invention is shown. The module 10 includes a first (top) plate 12 with an inlet 14 for receiving coolant and a second (bottom) plate 16 with an outlet 18 for dispensing coolant. A plurality of substrates 20(a-c) are positioned one on top of the other between the top plate 12 and bottom plate 16. A gasket 22(a-d) is provided between the top plate 12, each of the substrates 20(a-c), and the bottom plate 16 respectively. A plurality of electrical leads 24 extend from the outer periphery of substrate 20a outside the module housing. The leads 24 are used for electrically coupling the chips in the module to external electrical components. The module 10 is held together by a plurality of screws 26 and bolts 28. The screws pass through the top plate 12, the substrates 20(a-c) and gaskets 22(a-d), and bottom plate 16. When clamped together by a tightening of the screws and bolts, the module 10 is liquid tight.

Each substrate 20 includes a top surface 30, a bottom surface 32 and an open region or hole 34 formed through the substrate. An attach area 36 is provided within the hole 34 and is used to attach a semiconductor chip package thereto. (Note that the chip packages intended to be housed within the module and various electrical features present on each substrate are not shown in FIGS. 1A and 1B for the sake of clarity, but are described below in detail.)

The bottom surface 32 of each substrate 20 includes a conduit 38 formed therein. The conduit 38 acts as a channel for controlling the direction of the flow of the coolant. It is useful to note that the conduit 38 encompasses the hole 34 and the attach area 36 of the substrate 20. The substrate 20 includes two coolant flow passage holes 40. The coolant passage holes 40 permit coolant to flow from the top surface 30 and into the conduit 38 on the bottom surface 32 of the substrate 20.

The gasket 22 has the same length and width dimensions as the substrate 20. The gasket 22 has an open region 42 in its center. As best illustrated in FIG. 1A, when the module 10 is clamped, the inlet 14, the open region 42, hole 34, attach area 36 and the two coolant passage holes 40 of substrate 20a are encompasses within the perimeter of the open region 42 of overlying gasket 22a. As best illustrated in FIG. 1B, the open region 42 of gaskets 22b–22d are sized to match the dimensions of the conduit 38 on the bottom surface 32 of each substrate 20a–20c respectively. The gasket 22 can be made of any material that is impervious to liquid. In a preferred embodiment, the thickness of the gasket is approximately 0.03 to 0.035 inches.

In one embodiment of the present invention, the gaskets are made of a Z-axis elastomeric material. This material is desirous because it is impervious to coolant and, therefore, is useful as a sealant between the substrates 20(a–c) and plates 14 and 16. The Z-axis material also has the unique ability to conduct electricity in the Z direction, but acts as an insulator in the X and Y direction.

Figure 2B:
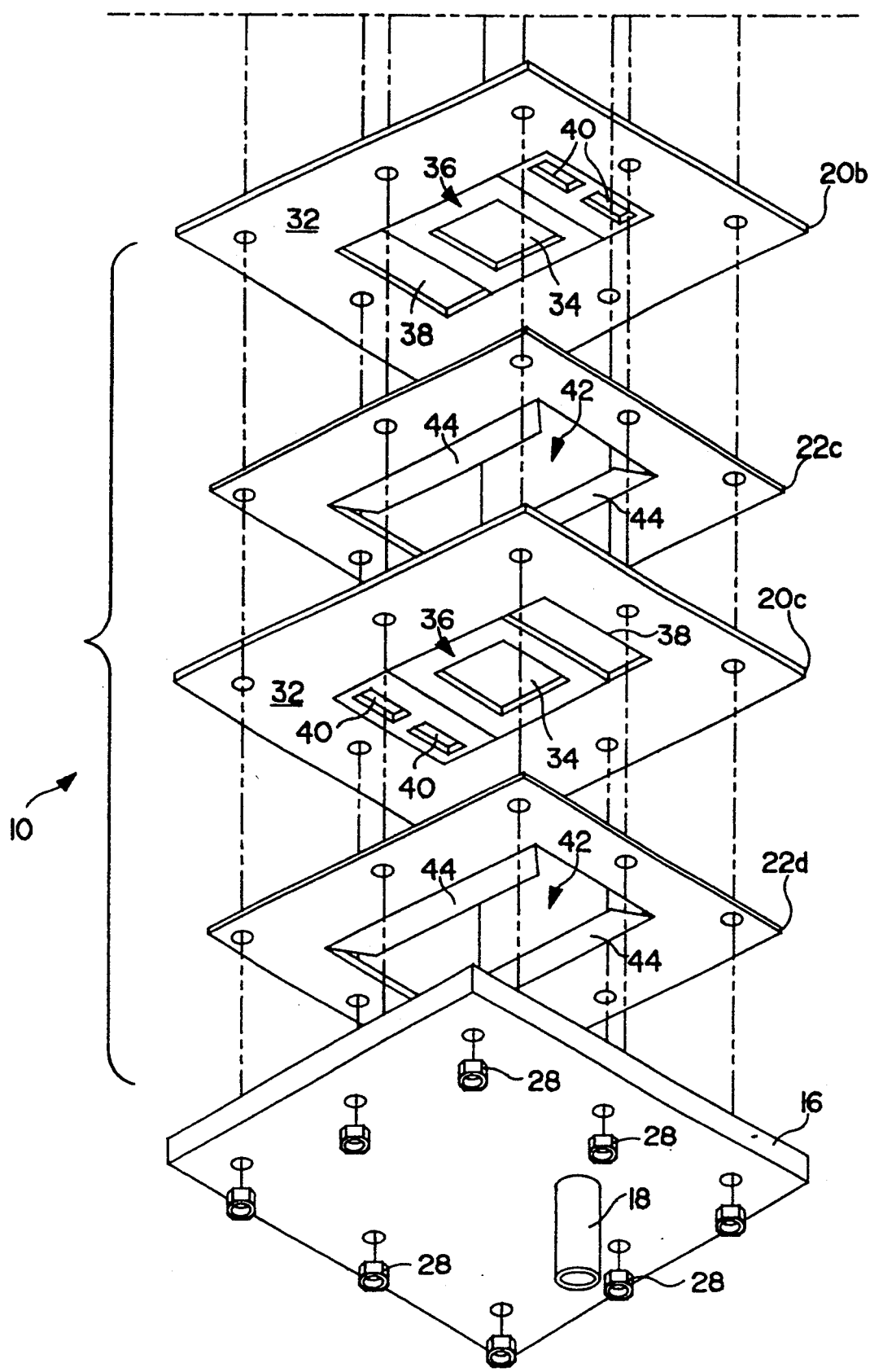

Referring to FIGS. 2A and 2B, an alternate embodiment of the invention is shown., The cooling module shown 10 in FIG. 2 is identical to that of FIG. 1, except the gaskets 22(a–d) have been modified. Each gasket 22 includes flaps 44 which extend into the open region 42 of the gasket. When the module is clamped, the flaps 44 tend to direct and restrict the flow of coolant over the hole region 42 of the substrate 20. Thus a higher concentration of coolant passes over the chip surface.

Figure 3A:
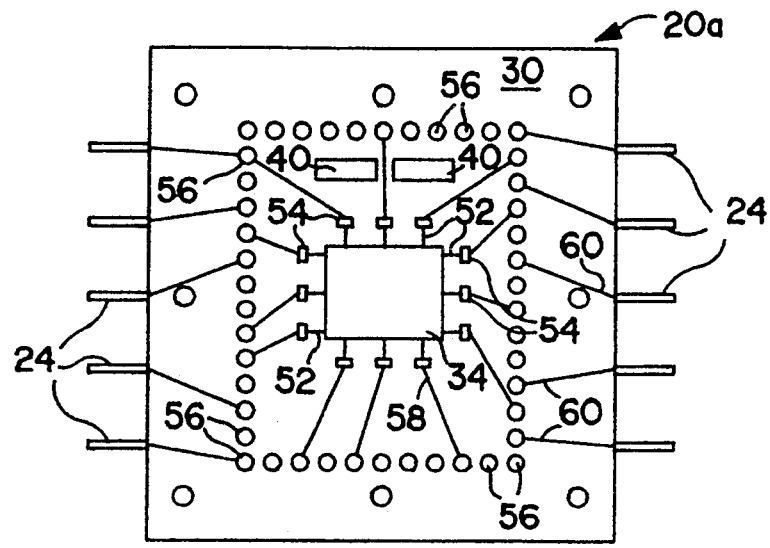
FIG. 3A illustrates a top view of the substrate used in the cooling module of the present invention.

Referring to FIG. 3A, a view of the top surface 30 of substrate 20 is shown. The substrate includes a Tape Automated Bonded (TAB) chip package 50 attached to area 36 (not shown) and housed within the hole 34. The TAB chip package 50 includes a plurality of leads 52 extending outward from the chip package. Each lead 52 is bonded to one of a plurality of bond pads 54 on the top surface 30 of the substrate. Each bond pad 54 is coupled to one of a plurality of contact points 56 via a trace connection 58. Each of the leads 24 is also electrically coupled to a selected one of a plurality of contact points 56 through a trace interconnect 60. The trace connections 58 and 60 could be formed on the top surface 30 of substrate 20a or in the thickness of the substrate, between the top surface 30 and bottom surface 32 of the substrate.

The number of TAB package leads 52, bond pads 54, contact points 56, traces 58 and 60, and leads 24 shown in the figure have been greatly reduced for clarity. In actual embodiments, the TAB package may include more than five hundred leads 52, and therefore a large number of bond pads 54 and trace connections 58 will also need to be provided on the substrate. It should also be noted that the number of contact points 56 and leads 24 provided on substrate 20 may be greater than the number of leads 52 of the TAB package 50. These additional contact points 56 and leads 24 are used for electrical communication between chips on different substrate levels and with external components.

Figure 3B:
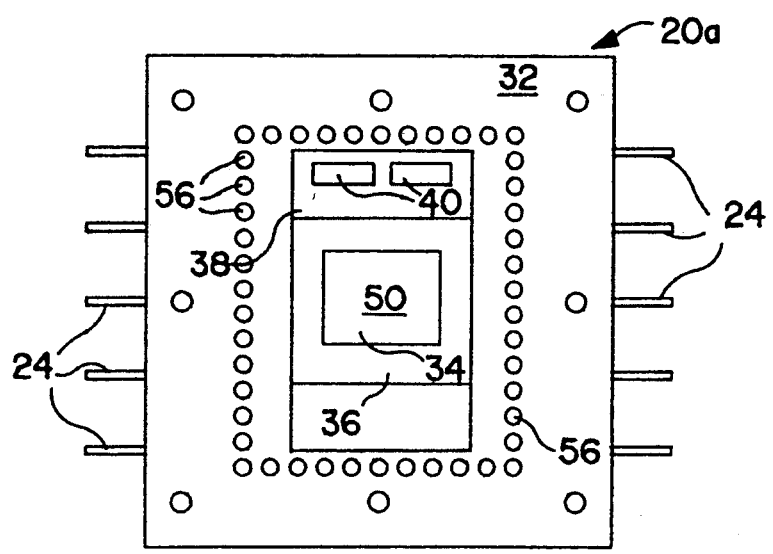
FIG. 3B illustrates a bottom view of the substrate used in the cooling module of the present invention.

Referring to FIG. 3B, a view of the bottom surface 32 of substrate 20a is shown. This view illustrates the bottom surface of the TAB package 50 exposed through the hole 34 in the substrate. The contact points 56 extend through the thickness of the substrate, and appear on the bottom surface of the substrate.

The Z-axis material and the contact points 56 on the substrates 20(a–c) facilitate electrical communication between the chips within the module. The contact points 56b of the intermediate substrate level 20b are aligned with the contact points 56a of the top substrate 20a and the bottom substrate 20c respectively. Thus, electrical signals can be transmitted between substrate levels via the Z-axis material. For example, the chip within TAB package 50a on substrate 20a may communicate with the chip on the bottom substrate 20c through a contact point 56 on substrate 20a, the Z-axis gasket 22b, an aligned contact point 56 on substrate 20b, Z-axis gasket 22c, and finally contact point 56 on substrate 20c. Electrical communication can also take place in a similar manner between a chip within the module 10 and an external component in a similar manner. For example, a chip on substrate 20b may communicate through contact point 56 on substrate 20b, the Z-axis gasket 22b, an aligned contact point 56 coupled to a lead 24 on substrate 20a.

Referring to FIG. 4, another embodiment of the present invention is shown. This second embodiment is a modification of the cooling module 10 described above, and has the ability of carrying additional chips that do not require cooling. This second cooling module 60 requires a modification to the top plate 12, the top substrate 20a, and the top gasket 22a. All the other elements, including substrates 20b and 20c, gaskets 22b–22d, and bottom plate 16 are identical to those described above, and are therefore not illustrated in this figure. Elements which are the same as those described above are designated with the same reference numerals herein.

The top plate 12 is modified by forming a hole 62 in the plate. The substrate 20a is modified by providing a flat top surface 30 with the hole 34 no longer present. The coolant passage holes 40 are also removed and replaced by a single hole 64 aligned with the inlet 14 of the top plate 12. The conduit 38 on the bottom surface 32 of the substrate remains intact. (Note the contact points 56 and traces 58 on the top surface of substrate 20a are not illustrated for clarity.) The modified gasket 22a includes a cut-out region 66 which matches the dimensions of the hole 62 of the top plate 12 and a hole 68 aligned between the inlet 14 and the hole 64 of substrate 20a. Thus, when the module is clamped together, coolant bypasses the top surface 30a of substrate 20a, and directly enters conduit 38a on the bottom surface 32a of substrate 20a. The portions of the top surface 32 exposed through the top plate 12 may be populated with chips 69, such as DRAMS, which do not need cooling. The chips 69 are mounted onto the substrate and each lead is coupled to a selected one of the plurality of contact points 56 on the substrate (not shown).

Figure 5:
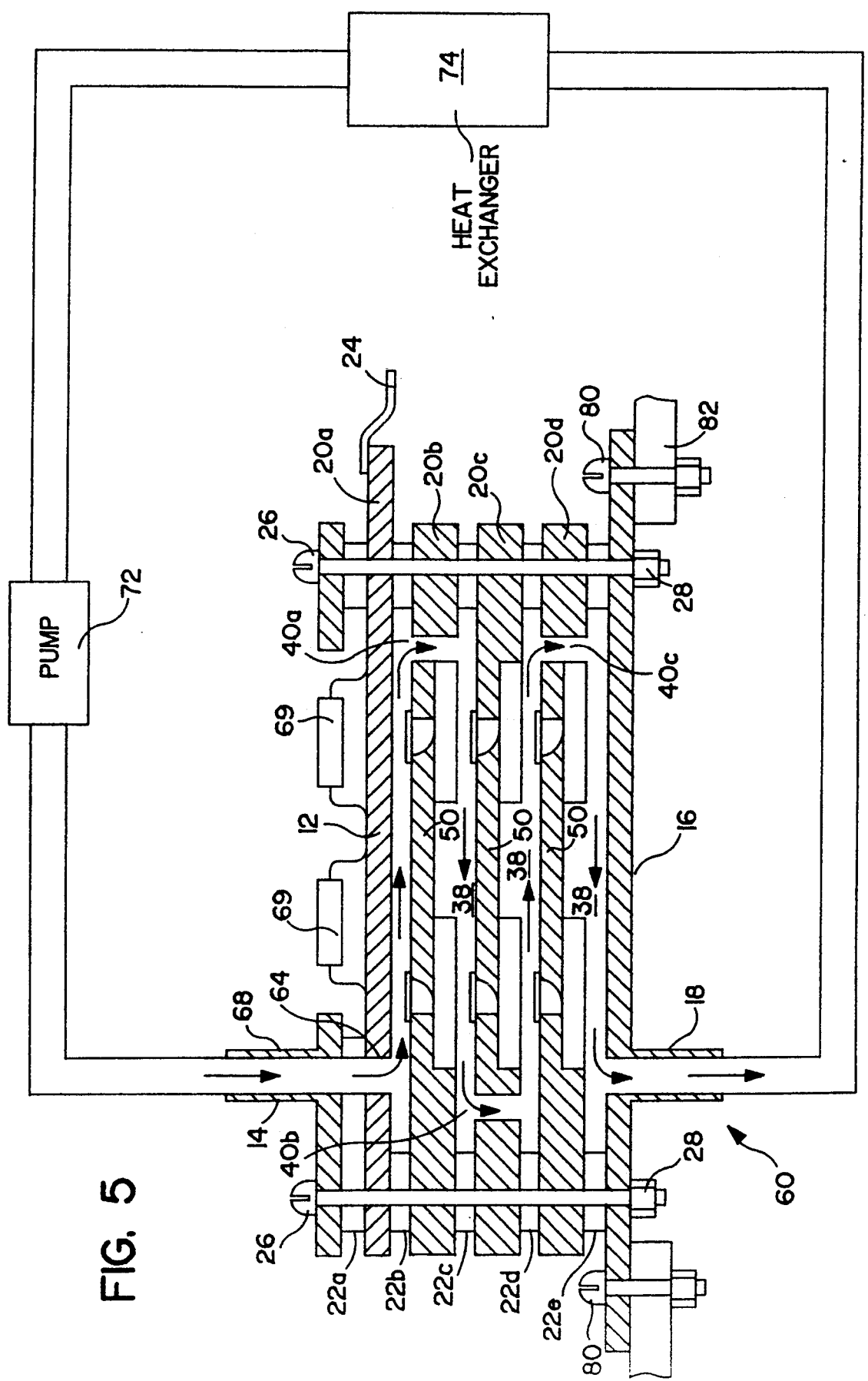
FIG. 5 illustrates a chip cooling system according to the present invention.

Referring to FIG. 5, a chip cooling system according to the present invention is shown. The cooling system 70 includes the multi-chip cooling module 60, a pump 72 for circulating coolant, and a heat exchange assembly 74. Screws 80 clamp the module 60 to a printed circuit board 82. The leads 24 from substrate 20a electrically couple the chips inside the module to external components on the circuit board (not shown). The chip cooling module 10 could also be used in a similar chip cooling system.

During operation, the pump introduces the coolant into the module 60 through the inlet 14 on the top plate 12. The coolant cascades through the module, cooling the chips contained therein. The heated coolant exits the module 60 at outlet 18 of the bottom plate 16. The heated coolant enters the heat exchange assembly where it is cooled. The coolant is then pumped back into the module 10 through the inlet 14.

The cross section view of the module 60 is useful for illustrating the operation of the module 60. The arrows in the figure show the direction of the flow of coolant in the module. When coolant is introduced into the module 60 though the inlet 14 of the top plate, the coolant passes through hole 68 of gasket 22a and hole 64 of substrate 20a and enters the conduit region 38 of substrate 20a. The coolant flows over the top surface of the chip package 50b of substrate 20b. The coolant then flows through the passage holes 40 and into the conduit 38 of substrate 20b, thereby cooling the bottom of chip package 50b and the top of chip package 50c of substrate 20c. The coolant passes through substrate 20c and cools the bottom of chip package 50c in the identical manner as described above. The coolant thus cascades through the module sequentially from substrate to substrate. The coolant finally exits the module at outlet 18 of the bottom plate 16. At each substrate 20 level, heat from the top surface and the bottom surface of the chip package is removed, thereby cooling the chip contained therein.

In the particular embodiment shown in FIG. 1, the chip package 50 is a Tape Automated Bond (TAB) package. It would be obvious to one skilled in the art to use other types of chip packages, such as leadless chip carriers or even a packageless semiconductor die.

The coolant can comprise either a liquid or a gas which is electrically non-conductive, non-corrosive and with excellent heat transfer characteristics. In one embodiment of the present invention, polyalphaolefin is used as the coolant.

In various embodiments of the present invention, the attach area 36 is made of a highly heat conductive material with good chip package attach characteristics, such as aluminum-nitride or copper-tungsten. The bottom surface of the attach area 36 may also be corrugated. The corrugated surface increases the total amount of surface area exposed to coolant, and therefore has better heat transfer characteristics.

While the invention has been described in relationship to the embodiments shown in the accompanying figures, other alternatives, embodiments and modifications will be apparent to those skilled in the art. It is intended that the specification be only exemplary, and that the true scope and spirit of the invention be indicated by the following claims.

What is claimed is:

1. A method of cooling a semiconductor chip, comprising the steps of:
   exposing a top surface and a bottom surface of a chip on a substrate; and
   circulating coolant over the exposed top surface and the bottom surface of the chip on the substrate.

2. The method of claim 1, wherein the circulating step further comprises the steps of:
   passing the coolant over the top surface of the chip, passing the coolant through the substrate, and passing the coolant over the bottom surface of the chip.

3. The method of claim 1, further comprising the steps of:
   providing a second chip on a second substrate adjacent the first substrate; and
   circulating coolant over exposed top and bottom surfaces of the second chip.

4. The method of claim 3, further comprising the step of:
   providing a gasket between the first substrate and the second substrate in the module.

5. The method of claim 4, further comprising the step of electrically communicating between the first chip on the first substrate and the second chip on the second substrate through the gasket.

6. The method of claim 5, further comprising the step of using a Z-axis material as a gasket.

7. The method of claim 1, further comprising the steps of:
   providing a first plate for receiving coolant;
   providing a second plate for dispensing coolant;
   forming a cooling module by positioning the substrate between the first plate and second plate.

8. A method for providing a cooling module for semiconductor chips, comprising the steps of:
   providing a member for carrying a chip; and
   positioning the chip on the member so that a substantial portion of a top surface and a bottom surface of the chip is exposed to coolant when coolant is circulated through the module.

9. The method of claim 8, further comprising the steps of providing a top plate for receiving the coolant and providing a bottom plate for dispensing the coolant from the module, and the positioning step further includes the step of positioning the chip on the member between the first plate and the second plate in the module.

10. The method of claim 8, wherein the positioning step further comprises the step of inserting the chip into an open region in the member.

11. The method of claim 8, further comprising the step of forming a conduit in the member for channeling coolant over the exposed bottom surface of the chip.

12. The method of claim 8, further comprising the step of forming a hole in the member so that coolant can pass from the top surface of the chip to the bottom surface of the chip.

13. The method of claim 9, further comprising the step of providing a second member for carrying a second chip and positioning the member adjacent the second member between the top plate and the bottom plate of the module.

14. The method of claim 13, further comprising the step of providing a gasket adjacent the member and the second member between the top plate and the bottom plate in the module.

15. The method of claim 14, wherein the gasket is made of an elastomeric material for enabling electrical communication between the fast chip on the member and the adjacent second chip on the second member.

16. The method of claim 14, wherein the gasket is further for channeling coolant over the bottom surface of the first chip on the member and a top surface of the second chip on the second member.

17. The method of claim 13, further comprising the step of positioning the member so as to form a conduit for coolant starting at the inlet of the top plate, over the top surface of the first chip, through the member, and across the bottom surface of the first chip.

18. The method of claim 17, further comprising the step of positioning the second member so as to form a conduit for coolant starting at the top surface of the second chip, through the second member, across the bottom surface of the second chip, and then through the outlet of the second plate.

19. The method of claim 8, further including the step of providing a metal interconnect on the member for enabling the chip to electrically communicate with other electrical components.

20. The method of claim 19, wherein the external components are located either on the member or remote from the member.

21. The method of claim 8, further comprising the step of providing leads for the module to enable the chip to communicate with other electrical components external to the module.

22. The method of claim 9, further comprising the step of providing a second member for carrying a second chip that does not require cooling.

23. The method of claim 9, further comprising the step of providing a gasket between the top plate and the member in the module.

* * * * *